United States Patent
Corral et al.

(10) Patent No.: US 10,779,398 B2
(45) Date of Patent: Sep. 15, 2020

(54) VIRTUAL SILK SCREEN FOR PRINTED CIRCUIT BOARDS

(71) Applicant: ARRIS Enterprises LLC, Suwanee, GA (US)

(72) Inventors: Humberto Cruz Corral, Apodaca (MX); Carlos Gonzalez Inda, Guadalupe (MX); Oswaldo Enrique Linares Rivas, Guadalupe (MX); Luis Lopez Moreno, Apodaca (MX); Julio Cesar Ayala Vera, Apodaca (MX); Sergio Antonio Delon Canseco, Guadalupe (MX)

(73) Assignee: ARRIS ENTERPRISES LLC, Suwanee, GA (US)

( * ) Notice: Subject to any disclaimer, the term of this patent is extended or adjusted under 35 U.S.C. 154(b) by 0 days.

(21) Appl. No.: 16/227,463

(22) Filed: Dec. 20, 2018

(65) Prior Publication Data

US 2020/0205281 A1    Jun. 25, 2020

(51) Int. Cl.
*H05K 1/02* (2006.01)
*B41C 1/14* (2006.01)
*H05K 3/12* (2006.01)

(52) U.S. Cl.
CPC .............. *H05K 1/0266* (2013.01); *B41C 1/14* (2013.01); *H05K 3/1225* (2013.01); *H05K 2201/09936* (2013.01)

(58) Field of Classification Search
None
See application file for complete search history.

(56) References Cited

U.S. PATENT DOCUMENTS

| 7,050,078 | B2 * | 5/2006 | Dempski | G01S 3/7864 |
| | | | | 345/7 |
| 9,411,010 | B2 * | 8/2016 | Goyal | G01R 31/2834 |
| 2011/0164163 | A1 * | 7/2011 | Bilbrey | G06F 1/1694 |
| | | | | 348/333.01 |
| 2016/0203648 | A1 * | 7/2016 | Bilbrey | G06F 1/1694 |
| | | | | 348/333.02 |
| 2018/0136255 | A1 * | 5/2018 | Albert | G01R 1/06794 |

OTHER PUBLICATIONS

Hahn, Jürgen, Bernd Ludwig, and Christian Wolff. "Augmented reality-based training of the PCB assembly process." Proceedings of the 14th International Conference on Mobile and Ubiquitous Multimedia. ACM, 2015.*

Hahn, Jürgen, Bernd Ludwig, and Christian Wolff. "Mixed Reality-based Process Control of Automatic Printed Circuit Board Assembly Lines." Extended Abstracts of the 2018 CHI Conference on Human Factors in Computing Systems. ACM, 2018.*

* cited by examiner

*Primary Examiner* — Ryan M Gray
(74) *Attorney, Agent, or Firm* — Buchanan Ingersoll & Rooney PC

(57) ABSTRACT

Methods and devices that identify a silkscreen data file associated with a physical printed circuit board and use an image of the physical printed circuit board to display a virtual silkscreen over the image of the physical printed circuit board.

17 Claims, 8 Drawing Sheets

VIRTUAL SILK SCREEN FOR PRINTED CIRCUIT BOARDS

CROSS-REFERENCE TO RELATED APPLICATIONS

None.

BACKGROUND

The subject matter of this application relates to silk screens.

A printed circuit board (PCB) mechanically supports and electrically connects electronic components using conductive traces, pads, and other features etched from one or more layers of copper foil that are laminated onto and/or between layers of a non-conductive substrate. Components are generally soldered onto the etched PCB to mechanically attach the components to the PCB and to electrically connect the components via the etched tracings.

A "silkscreen" is a printed legend on the PCB that graphically identifies the components, test points, etc. using symbols or identifying text for humans to read and interpret. This information may include component reference designators, company logos, manufacturer marks, warning symbols, part numbers, version numbers, date codes, and other markings. While a silkscreen is not strictly needed to manufacture or use a PCB, it nonetheless aids in the assembly of the circuit board by providing references during construction and assists in later troubleshooting.

While silkscreens were originally imprinted on a PCB using a silkscreen printing process, i.e. one that required a sheet of fine cloth like silk or polyester as a screen, modern techniques for imprinting PCBs with silkscreens utilize much faster apparatuses, such as custom inkjet printers. Regardless of the process used, many printed silkscreens are difficult to read on the PCB. Therefore, improved apparatuses, systems, and methods are desired for creating a silkscreen for a PCB.

SUMMARY OF THE DISCLOSURE

A first embodiment of the disclosure may include a device with a memory, a processor, and a display. The memory may store a silkscreen data file comprising a printed legend of identifiers of components associated with a physical printed circuit board. The display may show an image of the physical printed circuit board. The processor may be configured to use the silkscreen data file to overlay a visual depiction of a silkscreen over the image of the physical printed circuit board on the display.

A second embodiment of the disclosure may comprise a method implemented on an electronic device having a display, a memory, and a processor. The method may receive an identifier associated with a physical printed circuit board and use the identifier to select a silkscreen data file associated with the selected physical printed circuit board. The method may then use the silkscreen data file to create an image on the display, of a silkscreen superimposed upon the physical printed circuit board.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

As noted earlier, existing techniques that print silkscreens onto a PCB often produce illegible images. This may occur for many reasons. For example, it is common when designing the PCB layout to move and rotate the components on the layout. However, component reference designator codes on the silkscreen move and rotate with them since they are attached to the components. Thus, one common problem is that markings on a PCB may be printed with different angular orientations relative to each other, which often causes markings to overlap.

Second, silkscreen layouts will often have markings that overlap with contact pads and vias. Manufacturers, concerned that the printed material over these electrical surfaces may interfere with the operation of the PCB, will therefore trim the silkscreen layout to omit these overlapping portions of the silkscreen. Moreover, via holes do not have any surface to print over, thus even were a silkscreen layout not trimmed, the portions of the silkscreen that overlap a hole in a via would not be printed.

Third, silkscreen markings may be obscured by components later soldered onto the PCB. Moreover, silkscreen legibility may be adversely affected by the lack of spacing on highly populated PCBs or small PCBs, often resulting with incorrectly installed polarized components, misidentified components, etc.

Figure 1:
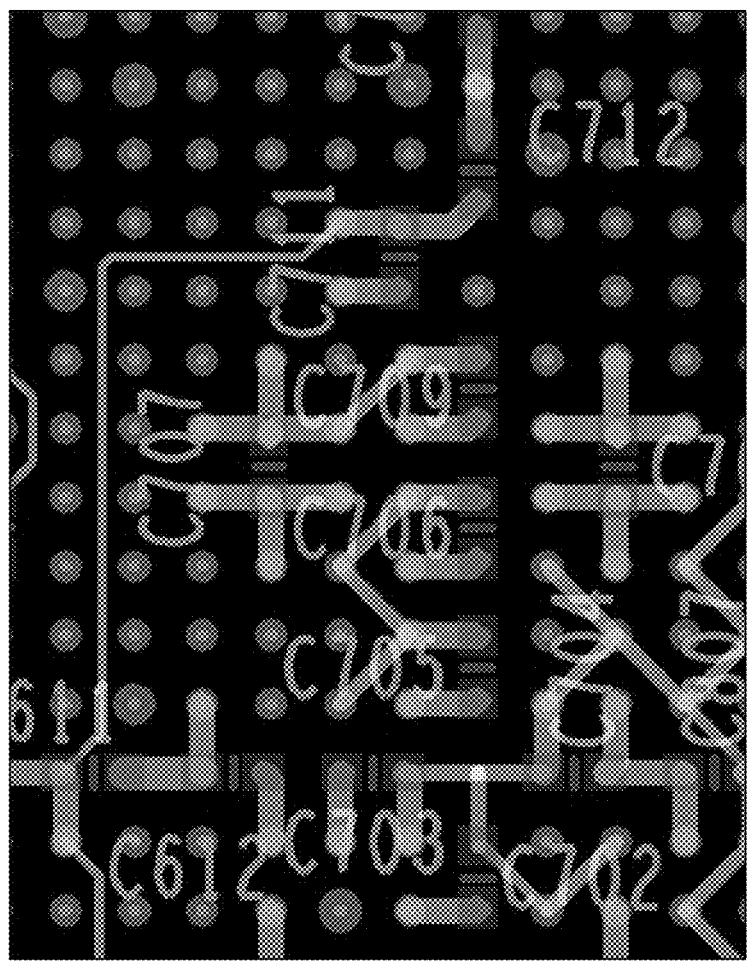
FIG. 1 shows an exemplary computer-aided design (CAD) design file for a silkscreen to be imprinted on a PCB.
Figure 2:
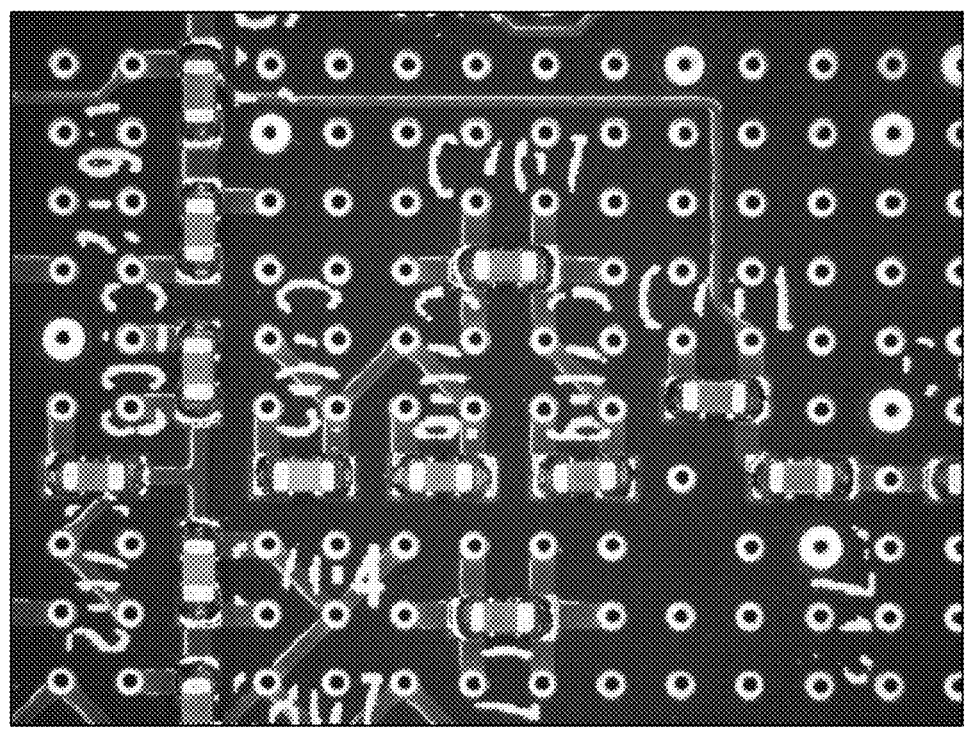
FIG. 2 shows an exemplary PCB having the silkscreen printed on it using existing silkscreen printing techniques.

FIG. 1, for example shows an exemplary CAD design file for a silkscreen to be oriented on a DSR daughterboard PCB, having a number of component reference designators, e.g. C612, C703, etc. FIG. 2, however, shows a physical DSR daughterboard having a silkscreen printed from the CAD file of FIG. 1, using existing silkscreen printing technologies. As can be seen from a comparison of these figures, none of the component reference designators from the CAD file are legible on the physical PCB.

Figure 3:
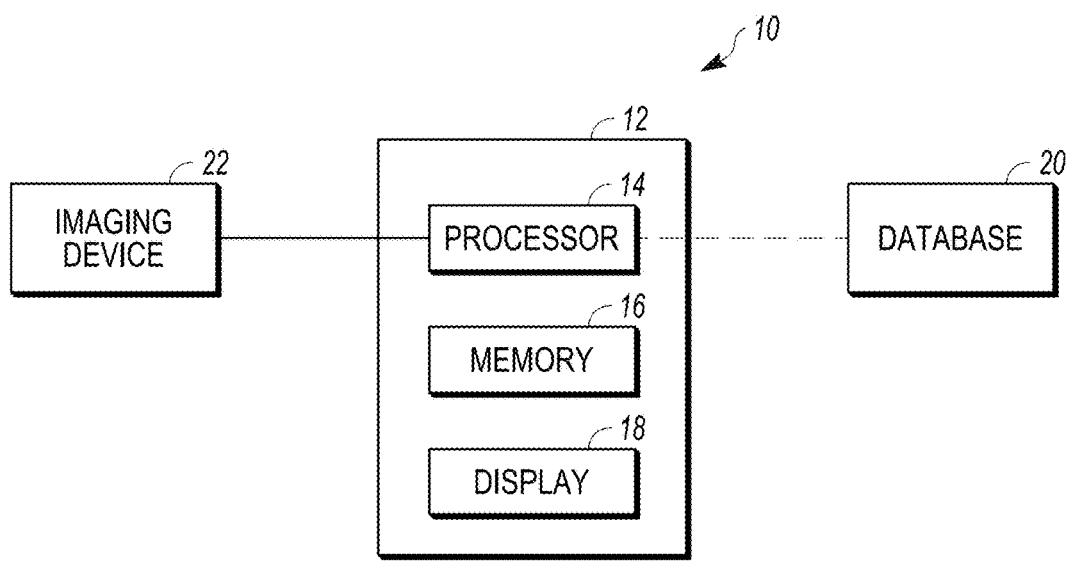
FIG. 3 shows an exemplary system capable of overlaying a virtual silkscreen information on a physical circuit board.

Referring to FIG. 3, an improved system 10 may be used for displaying a virtual silkscreen over an image of a physical PCB. The system 10 may include a device 12 that preferably has a processor 12, along with a memory 16 to store programming instructions in e.g. an application, and silkscreen data files as later described in this specification, along with a display 18 capable of displaying an image of a physical PCB upon which the virtual silkscreen may be overlaid. In some preferred embodiments, the display 18 is capable of displaying a real-time image of a physical PCB. The device preferably is connected to, or integrated with, a camera or an imaging sensor 22 capable of imaging a physical PCB, and is capable of connection to a network, such as the Internet or other network to download from a database 20 the application or other executable program disclosed in the present specification, along with silkscreen data files as later described.

The device 10 may in some embodiments be a mobile phone, tablet device, laptop, desktop, virtual video glasses, cameras, or any other appropriate device. In a preferred embodiment, the device 10 may be a mobile phone executing a stored application providing the functionality described in this specification, and having an integrated camera to display an image of a physical PCB upon which a virtual silkscreen is overlaid.

Preferably, upon execution of the stored application, the device 10 may be used to identify a particular PCB, from among a plurality of printed circuit boards, for which an associated virtual silkscreen is to be displayed or otherwise presented to a user. In one embodiment, for example, the device 10 may capture an image of a bar code, serial number, or other identification information printed on a PCB. In an alternative embodiment, the stored application may be capable of receiving text input identifying the PCB, such as a serial number or other identification information that uniquely identifies the PCB. In still other embodiments, the application may be capable of identifying a PCB by comparing the image of the PCB to images stored in a database. These examples are illustrative only, as any number of techniques may be available to those of ordinary skill in the art to select a PCB for which a virtual silkscreen is to be overlaid.

Figure 4:
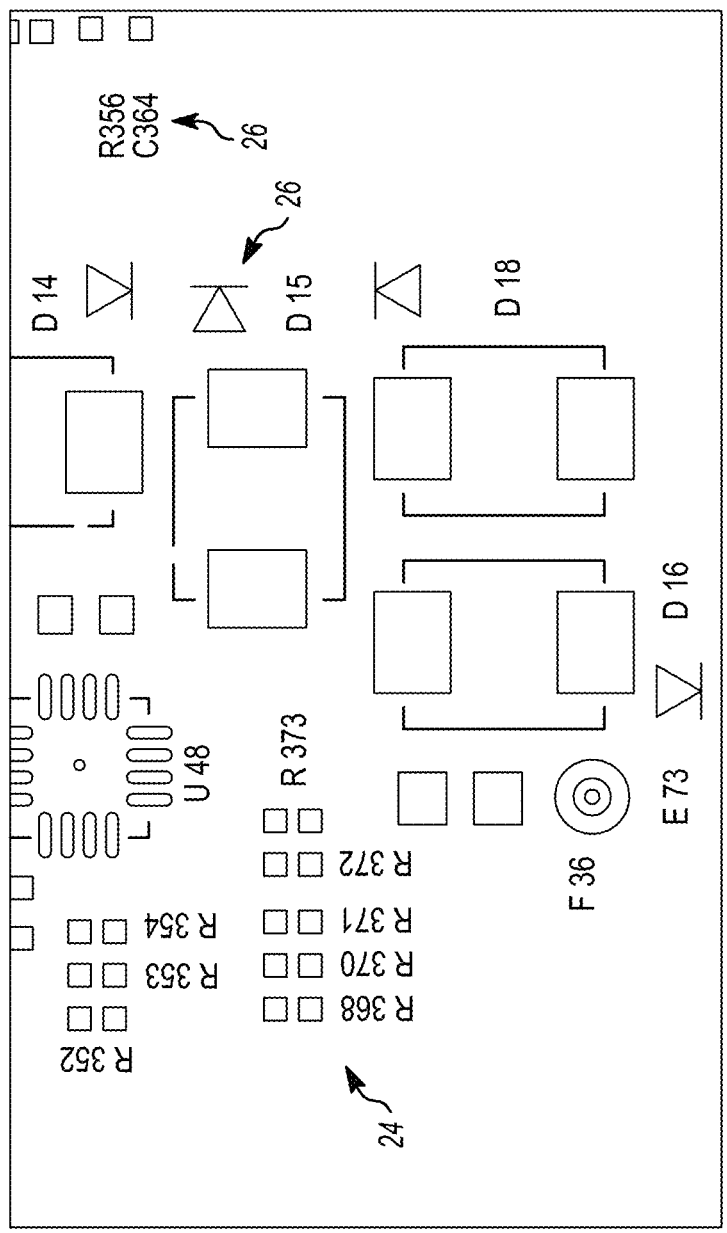
FIG. 4 shows an exemplary silkscreen data file used by the system of FIG. 3.
Figure 5A:
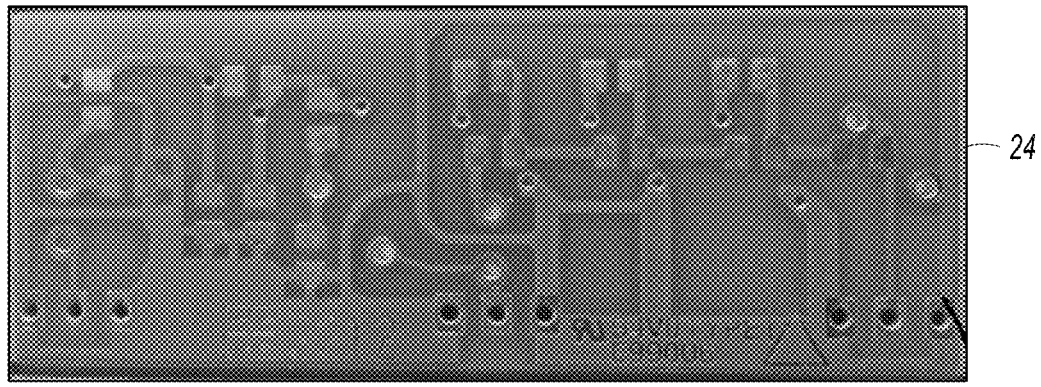
FIGS. 5A and 5B show exemplary circuit boards upon which the virtual silkscreen of FIG. 4 can be overlaid.
Figure 5B:
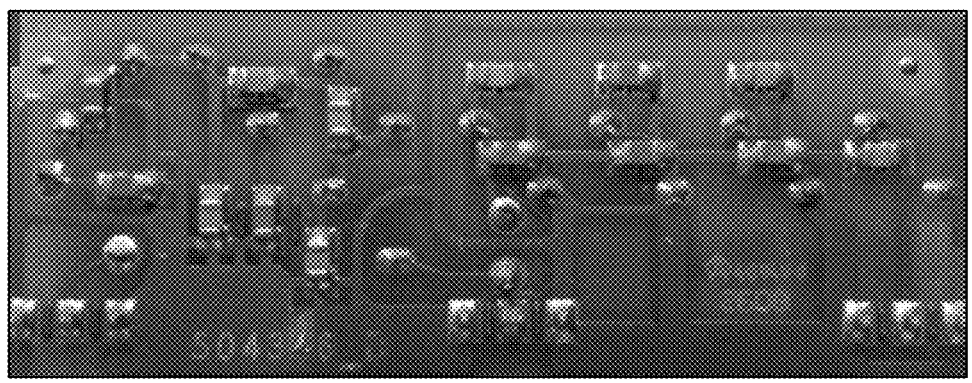

Once a particular PCB is identified by the device 10 using the executable application, the device 10 preferably uses that identification to obtain a silkscreen data file. The silkscreen data file may be obtained, for example, by downloading it from a remote location over a network connection, retrieved from a stored database in memory or other storage of the device 10, or any other method of retrieval. FIG. 4 shows an exemplary silkscreen data file 24 having a plurality of component reference designators 26, and FIG. 5A shows an exemplary PCB 28 for which the silkscreen data file 24 and its reference designators 26 are associated. The PCB 28 shown in FIG. 5A is unpopulated, but it may also be populated with components as shown in FIG. 5B. The silkscreen data file may be created using any available software or other tool, e.g. Allegro/Cadence, The PCB Expedition, PADs, Visula, etc.

Figure 6A:
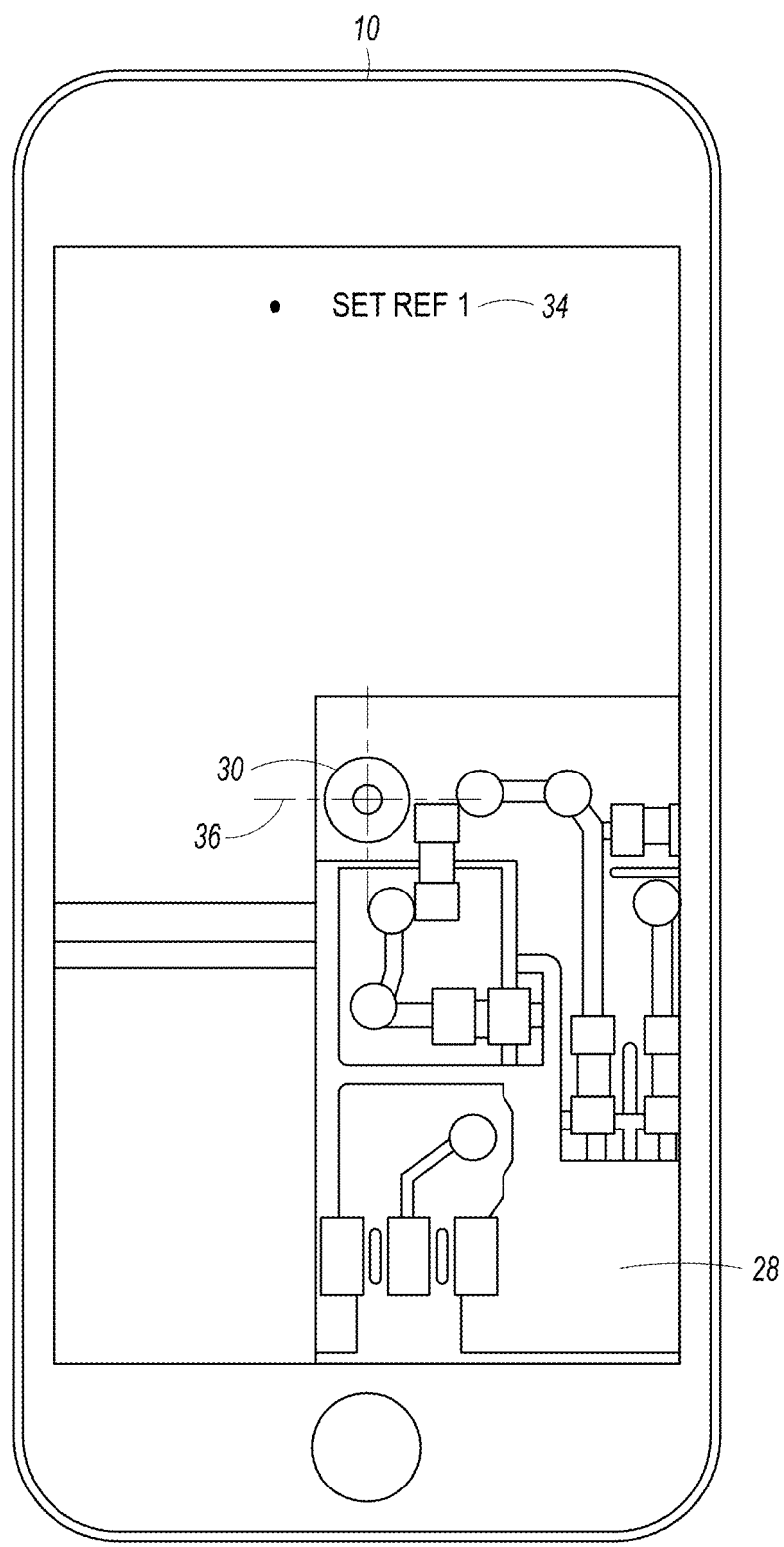
FIGS. 6A and 6B show exemplary steps for aligning the virtual silkscreen file of FIG. 4 on the circuit board of FIG. 5A and/or 5B.
Figure 6B:
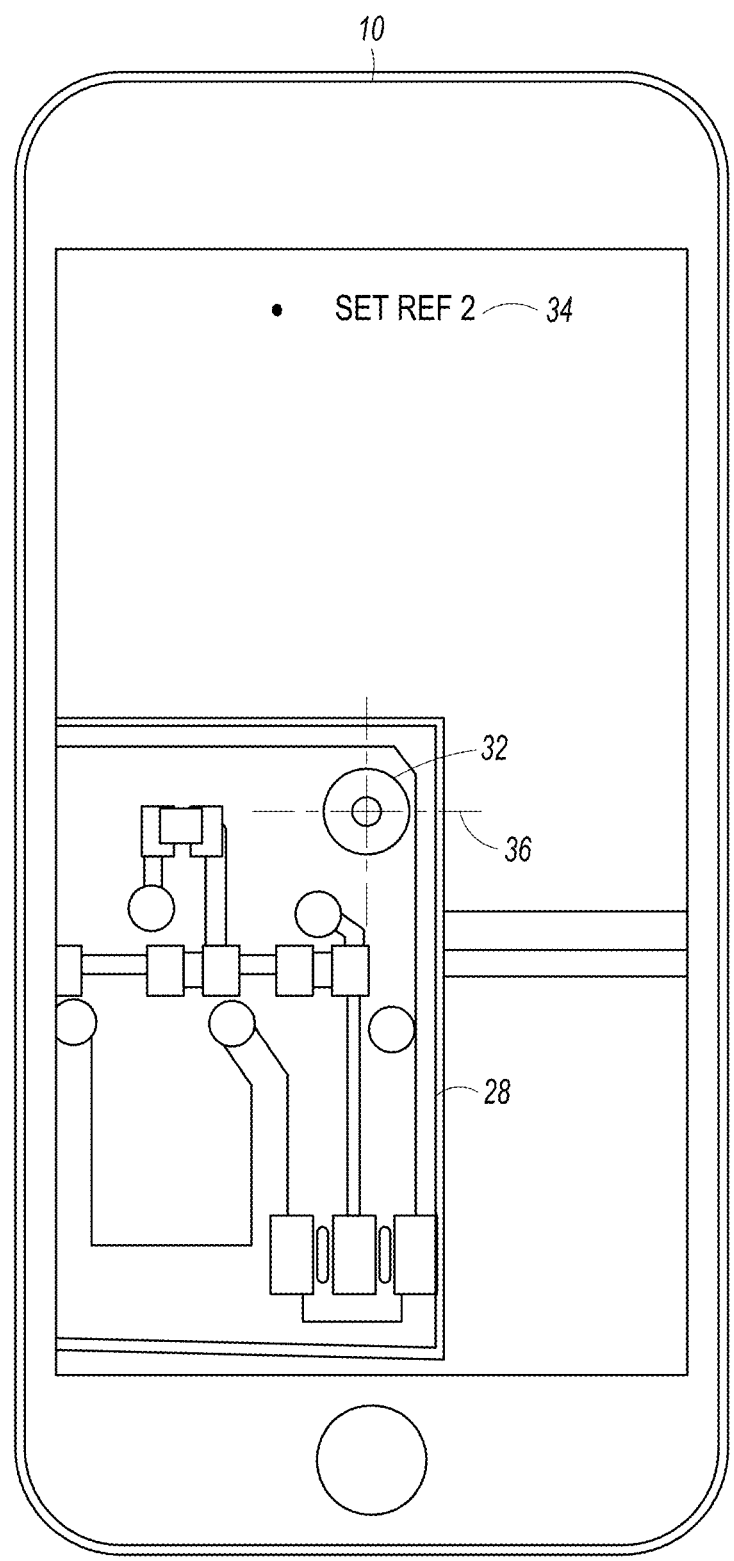

As described below, the device 12 shown schematically in FIG. 3 may access the silkscreen data file 24 associated with the PCB 28 and use the data file 24 to superimpose an image of the PCB 28 with virtual silkscreen overlaid on it. For example, in one preferred embodiment, as shown in FIGS. 6A and 6B, the device 10 may be a cell phone or other portable device capable of capturing an image of the PCB, either in real time, by download, by a stored image, or other means. The device 10 may also be preferably capable of browsing the image to identify specific components or locations, so as to identify a scale, orientation, and/or reference origin point of the image of the physical PCB 28. For example, as shown in FIGS. 6A and 6B, the device 10 may be equipped with a camera or image sensor that may be used by the executable application to browse over and select a first reference point 30 and a second reference point 32. Some embodiments may include a cursor or other target that may be placed over a reference point on the image of the physical PCB 28 for identification. The reference points 30 and 32 may be mounting holes at the corners of the physical PCB 28, vias, or any other readily identifiable component useful in determining the scale and/or orientation of the image of the physical PCB 28. Preferably, the application or other executable running on the device 10 includes prompts 34 instructing a user to select specific reference points used by the application. Those of ordinary skill in the art will appreciate that other embodiments may use alternative means for producing an image of the physical PCB 28. For example, the image of the physical PCB 28 scrolled and marked by the user may be a photograph of the physical PCB 28 stored in the memory of the device 10, may be an image displayed in a web browser of the device 10, etc.

Once the application or other executable on the device 10 has determined the scale, orientation, and/or reference origin point of the image of the physical PCB 28, the device 10 is preferably capable of displaying a virtual silkscreen over the image of the physical PCB, using the silkscreen data file 24, so that a user may identify the components on the physical PCB. In some embodiments the application or other executable operating on the device 10 includes functionality that allows a user to, e.g. show different views of the physical PCB 28 with the superimposed silkscreen, search for components, zoom in or out on the image, and other such functions.

Figure 7A:
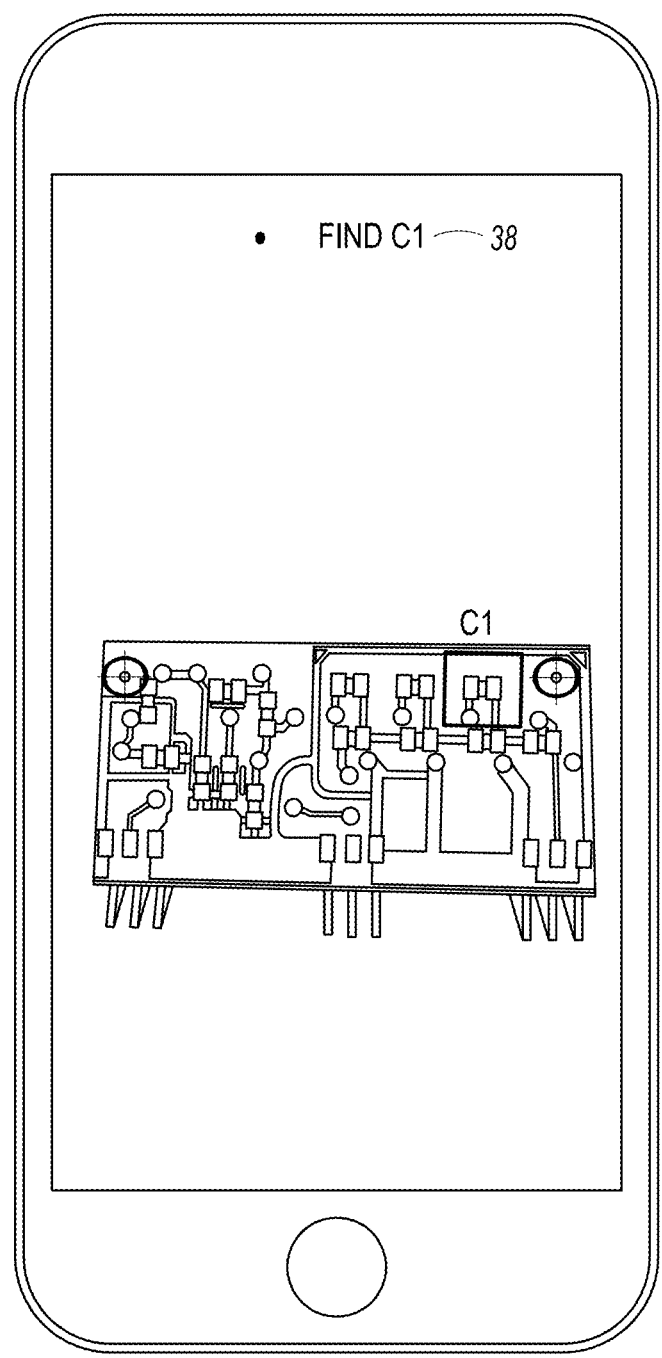
FIGS. 7A and 7B show exemplary functions executable by the system of FIG. 1.
Figure 7B:
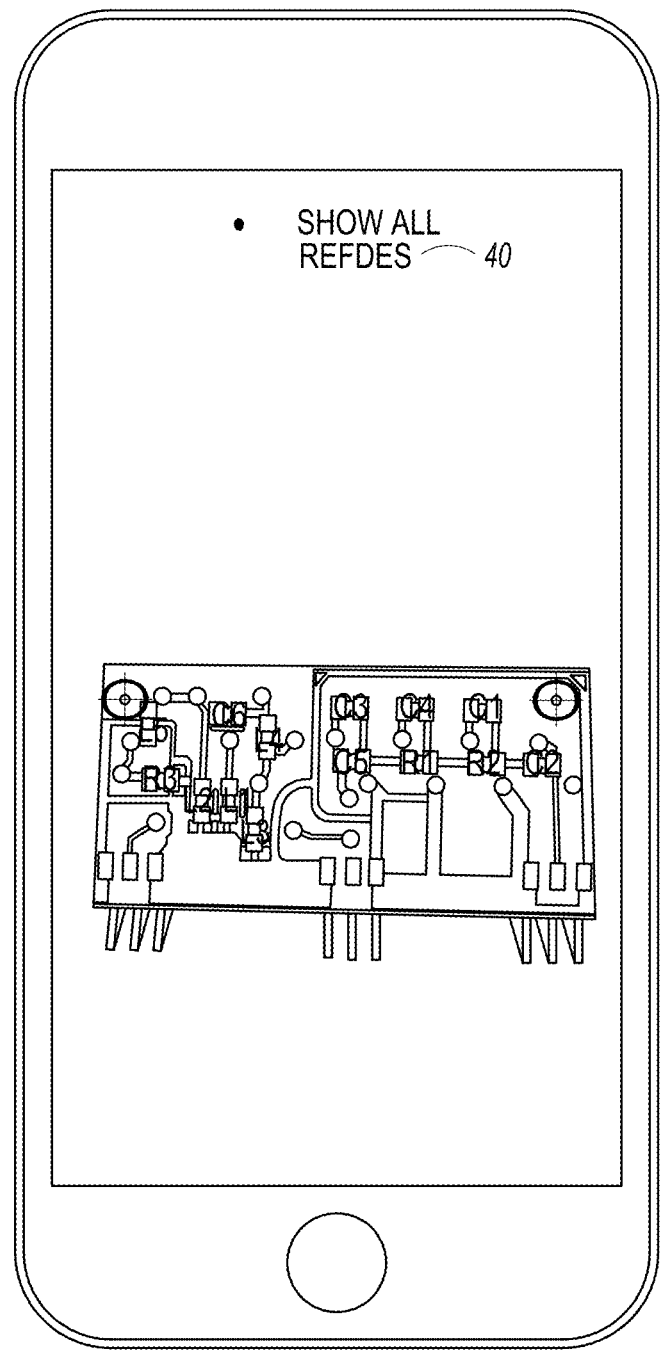

For example, referring to FIG. 7A, one embodiment of the application running on the device 10 may include a "Find" command or function 38 by which a component can be easily and quickly located on the image shown by the device 10. In this embodiment, a user may type "Find C1" for example and the application on the device 10 will highlight, mark, or otherwise identify the C1 capacitor on the silkscreen. The user may then use a pan and zoom functionality to focus on this capacitor to identify more detailed information about the component found. In some embodiments, the pan and zoom functionality may be implemented by a touchscreen interface typical of cell phones, use of arrow keys on a keyboard or a mouse, or any other interface. In some embodiments, as shown in FIG. 7B, the application on the device 10 may include a "Show all" function 40 by which the entire PCB with its superimposed virtual silkscreen may be viewed in the image so the user may quickly visually identify a component of interest, then pan, zoom, etc. to any specific component as desired. The functionality just described is exemplary only, as other functionality may be implemented by the application on the device 10, such as showing an aerial or works view of the PCM in a separate window on the screen, etc.

It will be appreciated that the invention is not restricted to the particular embodiment that has been described, and that variations may be made therein without departing from the scope of the invention as defined in the appended claims, as interpreted in accordance with principles of prevailing law, including the doctrine of equivalents or any other principle that enlarges the enforceable scope of a claim beyond its literal scope. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated. The word "comprise" or a derivative thereof, when used in a claim, is used in a nonexclusive sense that is not intended to exclude the presence of other elements or steps in a claimed structure or method.

We claim:

1. A device comprising:
   a memory that stores a silkscreen data file, the silkscreen data file comprising data for a silkscreen comprising a printable legend of identifiers of components associated with a physical printed circuit board;

a display showing an image of the physical printed circuit board, wherein the printable legend is not legibly printed on the physical printed circuit board; and a processor communicatively coupled to the memory and to the display, the processor configured to use the silkscreen data file to overlay a visual depiction of the printable legend of identifiers of components over the image of the physical printed circuit board on the display, wherein an overlaid identifier visually identifies a corresponding component depicted in the image of the physical circuit board.

2. The device of claim 1 wherein the image of the physical printed circuit board includes images of the components associated with the physical printed circuit board.

3. The device of claim 1 wherein the device displays prompts instructing a user to select one or more alignment reference points, and receives input from the user to align the visual depiction of the silkscreen with the image of the physical printed circuit board.

4. The device of claim 1 wherein the image of the silkscreen superimposed on the physical printed circuit board is navigable by a user.

5. The device of claim 1 wherein the image of the silkscreen superimposed on the physical printed circuit board is searchable by a user to identify specific components.

6. The device of claim 1 comprising a portable phone executing an application.

7. The device of claim 6 wherein the image of the printed circuit board is displayed in real time from an image sensor of the portable phone.

8. A method implemented on an electronic device having a display, a memory, and a processor, the method comprising:

receiving a first identifier associated with a physical printed circuit board;

using the first identifier to select a silkscreen data file associated with the identified printed circuit board, the silkscreen data file comprising data for a printable legend of identifiers of components associated with the physical printed circuit board; and using the silkscreen data file to create an image on the display depicting the printable legend of identifiers of components superimposed upon an image of the physical printed circuit board, wherein an overlaid identifier visually identifies a corresponding component depicted in the image of the physical circuit board, and wherein the printable legend is not legibly printed on the physical printed circuit board.

9. The method of claim 8 further comprising:
receiving the image of the physical printed circuit board.

10. The method of claim 9 wherein the image is received in real time from an image sensor on the electronic device.

11. The method of claim 9 wherein the image is stored in the memory on the electronic device.

12. The method of claim 9 further comprising:
receiving an input identifying first and second reference points on the image of the physical printed circuit board; and using the first and second reference points to determine at least one of a scale, an orientation, and a reference origin point for the physical printed circuit board.

13. The method of claim 12 further comprising:
using the at least one of the scale, orientation, and reference origin point to superimpose the silkscreen over the image of the physical printed circuit board.

14. The method of claim 12 further comprising:
providing a prompt to a user indicating features on the image of the physical printed circuit board to identify as the first and second reference points.

15. The method of claim 8 further comprising:
receiving an input identifying a component of interest and highlighting the component of interest.

16. The method of claim 8 further comprising:
navigating to a component of interest.

17. The method of claim 8 wherein the silkscreen data file is selected from a remote location and downloaded to the electronic device over a network.

* * * * *